(12) United States Patent
Yang et al.

(10) Patent No.: US 11,269,206 B2
(45) Date of Patent: Mar. 8, 2022

(54) FLEXIBLE DISPLAY SUBSTRATE AND FLEXIBLE DISPLAY DEVICE

(71) Applicant: BOE TECHNOLOGY GROUP CO., LTD., Beijing (CN)

(72) Inventors: Qian Yang, Beijing (CN); Pinfan Wang, Beijing (CN); Libin Liu, Beijing (CN); Chunyan Xie, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 116 days.

(21) Appl. No.: 16/768,632

(22) PCT Filed: Dec. 26, 2019

(86) PCT No.: PCT/CN2019/128538
§ 371 (c)(1),
(2) Date: May 29, 2020

(87) PCT Pub. No.: WO2020/168823
PCT Pub. Date: Aug. 27, 2020

(65) Prior Publication Data
US 2021/0208446 A1 Jul. 8, 2021

(30) Foreign Application Priority Data
Feb. 19, 2019 (CN) .......................... 201910122276.X

(51) Int. Cl.
*G02F 1/1333* (2006.01)
*G02F 1/1339* (2006.01)
(Continued)

(52) U.S. Cl.
CPC .... *G02F 1/133305* (2013.01); *G02F 1/13394* (2013.01); *G02F 1/133345* (2013.01);
(Continued)

(58) Field of Classification Search
None
See application file for complete search history.

(56) References Cited

U.S. PATENT DOCUMENTS

| 2007/0153075 A1 | 7/2007 | Lee |
| 2016/0049602 A1 | 2/2016 | Kim |

(Continued)

FOREIGN PATENT DOCUMENTS

| CN | 1994741 A | 7/2007 |
| CN | 106409867 A | 2/2017 |

(Continued)

OTHER PUBLICATIONS

State Intellectual Property Office of the People's Republic of China, Office Action and Search Report Issued in Application No. 201910122276.X, dated Jan. 15, 2020, 13 pages. (Submitted with Partial Translation).

(Continued)

*Primary Examiner* — Richard H Kim
(74) *Attorney, Agent, or Firm* — McCoy Russell LLP

(57) ABSTRACT

The present disclosure relates to a flexible display substrate and a flexible display device. The flexible display substrate includes a flexible base substrate and a pixel layer. The flexible base substrate includes: a plurality of opening regions, as well as a plurality of island regions and a plurality of bridge regions divided by the plurality of opening regions; and a pixel layer including a plurality of display units arranged in the plurality of island regions respectively, in which each of the plurality of display units is provided with a first groove, the first groove divides the corresponding display units into a display section and a dam section, and at least a part of the dam section is located between the display section and the bridge region adjacent to the display section.

20 Claims, 2 Drawing Sheets

(51) Int. Cl.
*H01L 51/00* (2006.01)
*H01L 51/52* (2006.01)

(52) U.S. Cl.
CPC ...... *H01L 51/0097* (2013.01); *H01L 51/5253* (2013.01); *G02F 1/13398* (2021.01)

(56) References Cited

U.S. PATENT DOCUMENTS

| | | |
|---|---|---|
| 2017/0031323 A1 | 2/2017 | Kim et al. |
| 2018/0052493 A1 | 2/2018 | Hong et al. |
| 2018/0114825 A1 | 4/2018 | Hong et al. |
| 2020/0052050 A1 | 2/2020 | Jiang et al. |
| 2020/0105170 A1 | 4/2020 | Dai et al. |

FOREIGN PATENT DOCUMENTS

| | | | |
|---|---|---|---|
| CN | 107994052 | A | 5/2018 |
| CN | 109064900 | A | 12/2018 |
| CN | 109148522 | A | 1/2019 |
| CN | 109308851 | A | 2/2019 |
| CN | 109830614 | A | 5/2019 |

OTHER PUBLICATIONS

ISA China National Intellectual Property Administration, International Search Report Issued in Application No. PCT/CN2019/128538, dated Mar. 27, 2020, WIPO, 15 pages. (Submitted with Partial Translation).

FLEXIBLE DISPLAY SUBSTRATE AND FLEXIBLE DISPLAY DEVICE

CROSS-REFERENCE TO RELATED APPLICATIONS

This application is the U.S. national phase of PCT Application No. PCT/CN2019/128538 filed on Dec. 26, 2019, which claims a priority to Chinese Patent Application No. 201910122276.X filed on Feb. 19, 2019. The entire contents of each of the above-listed applications are hereby incorporated by reference for all purposes.

TECHNICAL FIELD

The present disclosure relates to the field of display technology, and in particular, to a flexible display substrate and a flexible display device.

BACKGROUND AND SUMMARY

An organic light emitting diode (OLED) device has the characteristics of low power consumption, light weight, high brightness, wide field of vision and quick response. In addition, one of the most striking features of OLED devices is the ability to achieve flexible display functions, making them widely used in portable electronic equipment, wearable electronic equipment, in-vehicle electronic equipment, and other fields.

A flexible OLED device generally includes a substrate, a light emitting diode element arranged on the substrate, and a packaging layer located on the light emitting diode element. The substrate uses a flexible substrate to achieve a flexible display function. However, to achieve a stretchable display, each island region on the substrate needs to be packaged separately. Since the packaging layer has greater fluidity, the problem of package failure is likely to occur.

It should be noted that the information disclosed in the above background section is only for enhancing the understanding of the background of the present disclosure, and therefore may include information that does not constitute prior art known to a person skilled in the art.

According to an aspect of the present disclosure, a flexible display substrate is provided. The flexible display substrate includes: a flexible base substrate, including a plurality of opening regions, as well as a plurality of island regions and a plurality of bridge regions divided by the plurality of opening regions; and a pixel layer, including a plurality of display units arranged in the plurality of island regions respectively, in which each of the display units is provided with a first groove, the first groove divides the corresponding display units into a display section and a dam section, and at least a part of the dam section is located between the display section and the bridge region adjacent to the display section.

Optionally, the pixel layer further includes a second groove at a position corresponding to the bridge region, the second groove communicates with the first groove, and the dam section extends to the bridge region.

Optionally, the flexible display substrate further includes a photo spacer layer arranged on a surface of the dam section away from the flexible base substrate.

Optionally, a part of the photo spacer layer is located between the display section and the opening region adjacent to the display section, and another part of the photo spacer layer extends to the bridge region.

Optionally, the photo spacer layer is made of a polymer material.

Optionally, the photo spacer layer is made of aluminum oxide or titanium oxide.

Optionally, the first groove is in a ring shape and surrounds the display section.

Optionally, the flexible base substrate is exposed through the first groove.

Optionally, each of the plurality of island regions is surrounded by a plurality of the opening regions.

Optionally, the opening region is in strip shape.

Optionally, the opening region is in I-shape or L-shape.

Optionally, the opening region is in S-shape or arc-shape.

Optionally, the flexible display substrate further includes: a packaging layer including a plurality of packaging parts, in which each of the plurality of packaging parts covers the display sections respectively.

Optionally, the packaging layer includes an organic inkjet printing layer.

Optionally, the packaging layer includes an inorganic layer.

Optionally, the dam section is spaced from a side edge adjacent to the opening region by a distance.

Optionally, the flexible base substrate includes a film made of one material selected from a polyester polymer, a silicone polymer, an acrylic polymer, a polyolefin polymer, and copolymers thereof.

Optionally, the flexible base substrate is a single-layer structure or a multi-layer structure.

According to another aspect of the present disclosure, a flexible display device is provided which includes the above-mentioned flexible display substrate.

It should be understood that the above general description and the following detailed description are only exemplary and explanatory, and do not limit the present disclosure.

BRIEF DESCRIPTION OF THE DRAWINGS

The drawings herein are incorporated into and constitute a part of this specification, show embodiments consistent with the present disclosure, and are used together with the specification to explain the principles of the present disclosure. Obviously, the following drawings merely relate to some embodiments of the present disclosure. Based on these drawings, a person skilled in the art may obtain the other drawings without any creative effort.

DETAILED DESCRIPTION

Figure 1:
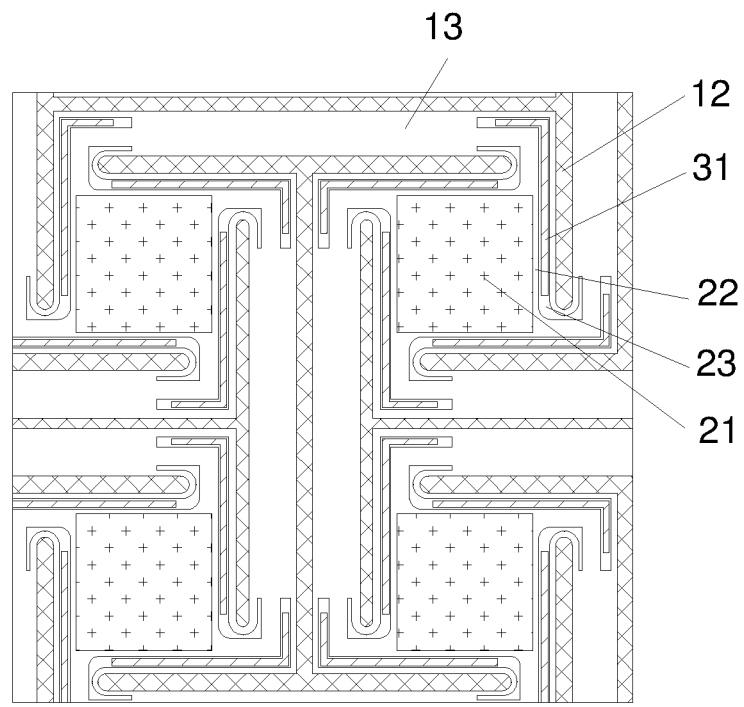
FIG. 1 is a schematic view showing a flexible display substrate according to an embodiment of the present disclosure.

Exemplary embodiments will now be described more in more details with reference to the drawings. However, the exemplary embodiments can be implemented in various forms and should not be construed as being limited to the embodiments set forth herein. On the contrary, these embodiments are provided such that the present disclosure will be comprehensive and complete and the idea of the exemplary embodiments will be well understood by a person skilled in the art. The similar reference numerals in the drawings denote the same or similar structures, and thus their detailed description will be omitted.

Although relative terms are used in this specification, such as "above" and "below" to describe the relative relationship between one component and another component, these terms are used in this specification only for convenience, for example, an exemplary direction described based on the drawings. It can be understood that if the device is turned upside down, the component described as "upper" will become the "lower" component. When a structure is "on" another structure, it may mean that the structure is integrally formed on the another structure, or that the structure is "directly" arranged on the another structure, or that the structure is "indirectly" arranged on the another structure through another structure.

The terms "a", "an", "the", "said" and "at least one" indicate the existence of one or more elements/components/etc.; the terms "include" and "have" means that in addition to the listed elements/components/etc., there can be additional elements/components/etc.; and the terms "first", "second", etc. are used only as marks, not to limit the number of objects.

Embodiments of the present disclosure provide a flexible display substrate. As shown in FIGS. 1 to 4, the flexible display substrate includes a flexible base substrate 1 and a pixel layer 2. The flexible base substrate 1 includes: a plurality of opening regions 12, as well as a plurality of island regions 11 and a plurality of bridge regions 13 divided by the plurality of opening regions 12. The pixel layer 2 includes a plurality of display units arranged on the plurality of island regions 11 respectively. Each of the display units is provided with a first groove 22, the first groove 22 divides the corresponding display units into a display section 21 and a dam section 23. At least a part of the dam section 23 is located between the display section 21 and the bridge region 13 adjacent to the display section 21.

When the flexible display substrate realizes the stretchable display, each island region needs to be packaged separately, and due to the large fluidity in the packaging layer, it easily flows to the opening region and causes water vapor to invade, thereby causing package failure. In the flexible display substrate provided by the present disclosure, a dam section is arranged between the display unit on the pixel layer and the adjacent opening region, and there is a first groove between the dam section and the display section. During packaging of the flexible display substrate, the first groove will play roles of performing drainage and containment on the packaging layer, and the dam section is capable of restricting the flow of the packaging layer. Thus it will avoid the packaging layer flowing to the opening region to cause packaging failure, and improve the reliability of the flexible display substrate during the packaging. And thereby it will increase the passing rate of the product, increase the production efficiency of the product, and reduce the manufacturing cost of the product.

The flexible base substrate is a substrate that supports various elements of the flexible display substrate and has flexibility. The flexible base substrate is called a flexible substrate or a flexible member. When the flexible base substrate is made of plastic, the flexible base substrate may be a plastic film or a plastic substrate. The flexible base substrate is formed in a shape of a rectangular parallelepiped (cuboid) or other shapes, which is not limited in the present disclosure.

Specifically, the flexible base substrate is made of a flexible material, for example, the flexible base substrate includes a film made of one materials selected from a polyester polymer, a silicone polymer, an acrylic polymer, a polyolefin polymer, and copolymers thereof. For example, the flexible base substrate may include a film of one selected from polysilane, polysiloxane, polysilazane, polycarbosilane, polyacrylate, cycloolefin copolymer (COC), cycloolefin polymer (COP), polyethylene (PE), polypropylene (PP), polystyrene (PS), polyformaldehyde (POM), polyetheretherketone (PEEK), polytetrafluoroethylene (PTFE), polyvinyl chloride (PVC), and combinations thereof.

In addition, the flexible base substrate may be a single-layer structure or a multi-layer structure. When the flexible display substrate is realized by a transparent flexible display substrate, the flexible base substrate is formed of a transparent flexible material.

Specifically, the pixel layer 2 includes a pixel defining structure, in which the pixel defining structure is formed with a plurality of pixel regions in one-to-one correspondence to the plurality of island regions 11, and each display section may include one or more sub-pixels.

In one embodiment, the pixel defining structure may be made of resin material and has certain flexibility. In addition, the pixel defining structure may be black or may contain light absorbing materials. The color of the pixel defining structure is black or contains light absorbing materials, which can absorb the reflected light, so that part or all of the reflected light in a sub-pixel region will neither be directed to the sub-pixel region adjacent thereto, nor be emitted outward through the pixel defining structure. It can make the anti-reflection performance of the side viewing angle of the display panel better.

In addition, the height of the pixel defining structure is not particularly limited, as long as the requirements are satisfied, a person skilled in the art can be selected freely according to needs. In an embodiment, the height of the pixel defining structure may be 1 to 3 microns. In some optional embodiments, the height of the pixel defining structure may be 1 to 2 microns, for example, the height of the pixel defining structure may be 1 micron, 1.2 microns, 1.4 microns, 1.6 microns, 1.8 microns, and 2 microns. In view of this, the thinner pixel defining structure is beneficial to realize the thinning of the flexible display substrate, thereby making it easier to achieve flexible display functions such as bending and folding.

Specifically, the pixel layer 2 further includes a second groove at a position corresponding to the bridge region 13. The second groove communicates with the first groove 22, and the dam section 23 extends to the bridge region 13. With this structure, the dam section 23 can play roles of performing drainage on the packaging layer, so that the packaging layer can flow along the first groove 22 to the second groove. Thus it can achieve the purpose of draining the packaging layer to the bridge region 13 and reducing the accumulation of the packaging layer in the island region.

Figure 2:
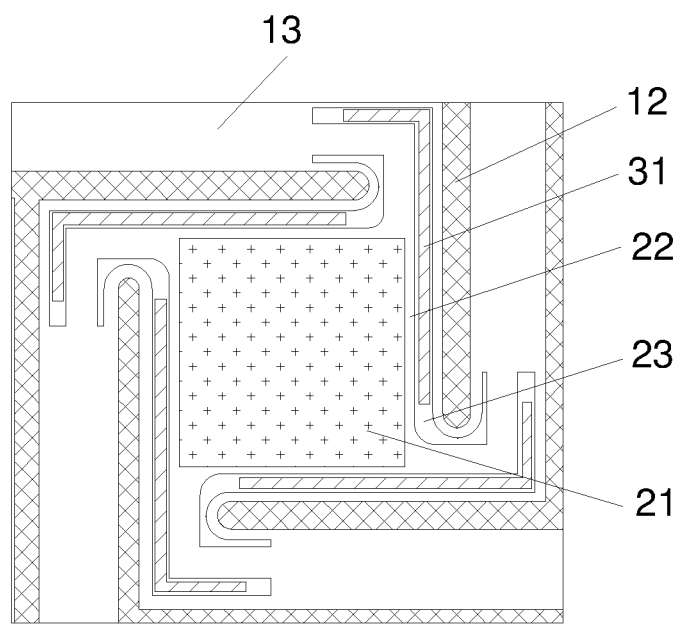
FIG. 2 is a partial enlarged view of FIG. 1.
Figure 3:
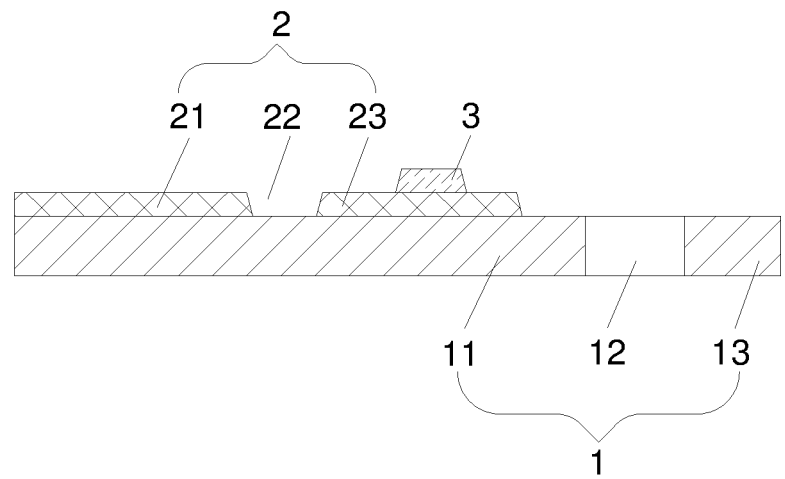
FIG. 3 is a partial schematic sectional view of FIG. 2.
Figure 4:
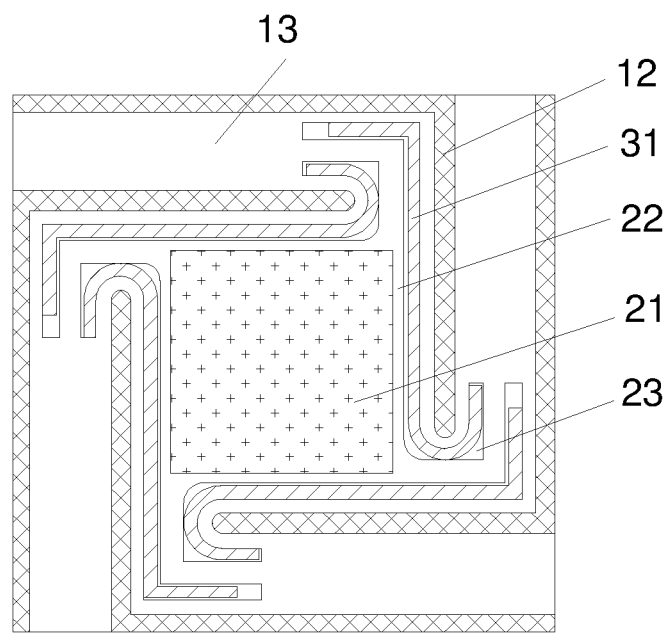
FIG. 4 is a schematic view showing a flexible display substrate according to another embodiment of the present disclosure.

As shown in FIGS. 1 to 3, the flexible display substrate further includes a photo spacer (PS) layer 3. The photo spacer layer 3 is arranged on a surface of the dam section 23 away from the flexible base substrate 1. By providing the photo spacer layer 3, the thickness of the display panel can be set, so that it can maintain a fixed thickness of the liquid crystal cell during the external environment change, and show good display quality. The external environment change includes temperature change, external impact, etc. At the same time, the photo spacer layer 3 is arranged on the dam section 23, and the photo spacer layer 3 plays a role of blocking the flow of the packaging layer to the opening region 12. Thus it can further increase the restriction on the flow of the packaging layer, and further improve the reliability of packaging the flexible display substrate.

In an embodiment, the photo spacer layer 3 is made of a polymer material, so that the photo spacer layer 3 has better flexibility and rigidity performance. The photo spacer layer 3 can also be selected from aluminum oxide or titanium oxide, because these two materials have better effect of buffering stress due to their own structural properties. A person skilled in the art may also select other materials to prepare the photo spacer layer 3, and set the density, width, height and other parameters of the photo spacer layer 3. The present disclosure does not impose limitation on these matters, and any solution, that can achieve the same technical effect, belongs to the protection scope of the present disclosure.

Optionally, as shown in FIG. 3, a part of the photo spacer layer 3 is located between the display section 21 and the opening region 12 adjacent to the display section 21, and another part of the photo spacer layer 3 extends to the bridge region 13. With this arrangement, on one hand, the supporting area of the photo spacer layer 3 is increased, thereby improving the supporting capacity of the photo spacer; on the other hand, the photo spacer layer 3 further improves the restriction on the flow of the packaging layer, so that the packaging layer can more reliably flow to the bridge region 13. Thus it can prevent the packaging layer from flowing from the bridge region 13 to the opening region 12, and further improve the reliability of packaging the flexible display substrate.

In addition, the photo spacer layer 3 may completely cover or partially cover the surface of the dam section 23 away from the flexible base substrate 1, which is not limited by the present disclosure. As shown in FIG. 3, the dam section 23 is wider than the photo spacer layer 3, the photo spacer layer 3 is arranged in the middle region of the surface of the dam section 23, and has a certain distance from the edges on both sides. With this arrangement, the supporting of the dam section 23 to the photo spacer layer 3 is increased, so that the dam section 23 can withstand a greater load. Thus it can avoid excessive load to be applied the dam section 23 and transmitted to the dam section 23 and further cause the dam section 23 to collapse.

As shown in FIG. 1, the first groove 22 is in ring shape and surrounds the display section 21, that is, the first groove 22 completely surrounds the display section 21, so that the packaging layer can play roles of performing drainage on the packaging layer regardless of along which edge of the display region the packaging layer flows. Thus it can prevent the flow of the package into the opening region 12, and improve the reliability of packaging the flexible display substrate.

As shown in FIG. 3, the flexible base substrate 1 is exposed through the first groove 22. When the flexible base substrate 1 can be exposed through the first groove 22, the depth of the first groove 22 is the largest at this time. The first groove 22 can accommodate a lot of packaging layer materials, and thus can improve the drainage capability. The first groove 22 can also accommodate more packaging layer materials, and thus can avoid the situation where after the packaging layer materials have filled the first groove 22, the packaging layer materials will overflow from the dam section 23, and then flow to the opening region 12, which generally causes the package fail.

As shown in FIG. 1, each island region 11 is surrounded by a plurality of opening regions 12, that is, each display unit is surrounded by the opening regions 12 respectively. Specifically, each island region 11 is surrounded by a plurality of opening regions 12, so as to achieve the purpose of bending or curving the flexible display substrate.

Specifically, as shown in FIGS. 1 and 2, the opening region 12 is in strip shape. The extending length of the strip-shaped opening region 12 is relatively long, and the occupied area is relatively small, and thus it is capable of ensuring that the flexible display substrate has sufficient flexibility. In one embodiment, the opening region 12 is in I-shape, in which the ends of the four I-shapes surround the island region 11, and the end of each I-shaped opening is spaced from the adjacent I-shape opening by a distance, so that the first groove 22 can communicate with the bridge region 13. With the I-shaped opening regions 12, and the opening regions 12 cooperate to form a plurality of island regions 11, so that the opening regions 12 corresponding to the plurality of island regions 11 communicate with each other. Thus it can improve the bending performance of the flexible display substrate. A person skilled in the art may also set the opening region 12 into other shapes, such as L-shape, S-shape, arc-shape, etc., which is not limited by the present disclosure.

As shown in FIG. 3, there is a separation distance between the dam section 23 and the side adjacent to the opening region 12. With this arrangement, when the flexible base substrate 1 is bent in the opening region 12, it can prevent the situation where the dam part 23 will deform too much when the dam part 23 is too close with the opening region 12. Further it can avoid the situation where the dam portion 23 and the photo spacer layer 3 arranged on the dam section 23 undergone unrecoverable deformation due to deforming too much of the dam part 23, and thus it can improve the reliability of the flexible display substrate. The size of the separation distance can be set by a person skilled in the art according to actual conditions, which is not limited by the present disclosure.

In an embodiment, the flexible display substrate further includes an packaging layer, in which the packaging layer includes a plurality of packaging sections, and each packaging section covers the display sections 21 respectively, so as to achieve the packaging of the flexible display substrate. In an embodiment, the packaging layer may include organic inkjet printing (IJP). The organic IJP has greater fluidity, and the flexible display substrate provided by the present disclosure can effectively play roles of performing drainage and barrier to the organic IJP, and thus it can avoid organic IJP material flowing into the opening region 12. In addition, the packaging layer may further include an inorganic layer in a multi-layer structure, which is not limited by the present disclosure.

The present disclosure also provides a flexible display device. The flexible display device includes the above-mentioned flexible display substrate. For the beneficial effects, please refer to the above-mentioned beneficial effects of the flexible display substrate, which will not be repeated herein. Specifically, the display device may be a mobile phone, a tablet computer, a television, a display, a notebook computer, a navigator, or any product or component having a display function.

A person skilled in the art will readily conceive of other embodiments of the present disclosure after considering the description and practicing the present disclosure. The present disclosure is intended to cover any variations, applications, or adaptive changes of the present disclosure, that follow the general principles of the present disclosure and include common general knowledge or customary technical means in the technical field not disclosed in the present disclosure. The description and embodiments are to be considered exemplary only, and the true scope and spirit of the present disclosure are defined by the appended claims.

The invention claimed is:

1. A flexible display substrate, comprising:
   a flexible base substrate comprising a plurality of opening regions, as well as a plurality of island regions and a plurality of bridge regions divided by the plurality of opening regions; and
   a pixel layer comprising a plurality of display units arranged on the plurality of island regions respectively, wherein each of the display units is provided with a first groove, the first groove divides the corresponding display units into a display section and a dam section, and at least a part of the dam section is located between the display section and the bridge region adjacent to the display section.

2. The flexible display substrate of claim 1, wherein the pixel layer further comprises a second groove at a position corresponding to the bridge region, the second groove communicates with the first groove, and the dam section extends to the bridge region.

3. The flexible display substrate of claim 2, wherein the flexible display substrate further comprises:
   a photo spacer layer arranged on a surface of the dam section away from the flexible base substrate.

4. The flexible display substrate of claim 3, wherein a part of the photo spacer layer is located between the display section and the opening region adjacent to the display section, and another part of the photo spacer layer extends to the bridge region.

5. The flexible display substrate of claim 3, wherein the photo spacer layer is made of a polymer material.

6. The flexible display substrate of claim 3, wherein the photo spacer layer is made of aluminum oxide or titanium oxide.

7. The flexible display substrate of claim 1, wherein the first groove is in a ring shape and surrounds the display section.

8. The flexible display substrate of claim 1, wherein the flexible base substrate is exposed through the first groove.

9. The flexible display substrate of claim 1, wherein each of the plurality of island regions is surrounded by the plurality of the opening regions.

10. The flexible display substrate of claim 1, wherein each of the plurality of opening regions is in a strip shape.

11. The flexible display substrate of claim 1, wherein each of the plurality of opening regions is in I-shape or L-shape.

12. The flexible display substrate of claim 1, wherein each of the plurality of opening regions is in S-shape or arc-shape.

13. The flexible display substrate of claim 1, wherein the flexible display substrate further comprises:
   a packaging layer comprising a plurality of packaging parts, wherein the plurality of packaging parts covers the display sections respectively.

14. The flexible display substrate of claim 13, wherein the packaging layer comprises an organic inkjet printing layer.

15. The flexible display substrate of claim 13, wherein the packaging layer comprises an inorganic layer.

16. The flexible display substrate of claim 1, wherein the dam section is spaced from a side edge adjacent to the opening region by a distance.

17. The flexible display substrate of claim 1, wherein the flexible base substrate comprises a film made of one material selected from a polyester polymer, a silicone polymer, an acrylic polymer, a polyolefin polymer, and copolymers thereof.

18. The flexible display substrate of claim 1, wherein the flexible base substrate is a single-layer structure or a multi-layer structure.

19. A flexible display device, comprising the flexible display substrate of claim 1.

20. The flexible display device of claim 19, wherein the pixel layer further comprises a second groove at a position corresponding to the bridge region, the second groove communicates with the first groove, and the dam section extends to the bridge region.

* * * * *